United States Patent
Brunelle et al.

(10) Patent No.: US 6,693,817 B2
(45) Date of Patent: Feb. 17, 2004

(54) REVERSED MEMORY MODULE SOCKET, MOTHERBOARD AND TEST SYSTEM INCLUDING SAME, AND METHOD OF MODIFYING MOTHERBOARD

(75) Inventors: Steven J. Brunelle, Boise, ID (US); Saeed Momenpour, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/342,773

(22) Filed: Jan. 13, 2003

(65) Prior Publication Data

US 2003/0137862 A1 Jul. 24, 2003

Related U.S. Application Data

(62) Division of application No. 09/904,260, filed on Jul. 12, 2001.

(51) Int. Cl.⁷ .................................................. H05K 1/14
(52) U.S. Cl. .............................. 365/63; 365/52; 365/69; 365/72; 324/755; 714/42; 714/718; 714/719
(58) Field of Search ............................. 365/52, 63, 69, 365/72; 324/755; 714/42, 718, 719

(56) References Cited

U.S. PATENT DOCUMENTS

| | | | | |
|---|---|---|---|---|
| 5,999,437 A | * | 12/1999 | Chengson et al. | 365/52 |
| 6,357,023 B1 | * | 3/2002 | Co et al. | 714/42 |
| 6,415,397 B1 | * | 7/2002 | Co et al. | 714/42 |
| 2002/0046374 A1 | | 4/2002 | Aoki et al. | |
| 2002/0133769 A1 | * | 9/2002 | Cowles et al. | 714/719 |
| 2003/0011391 A1 | * | 1/2003 | Brunelle et al. | 324/755 |
| 2003/0016040 A1 | * | 1/2003 | Brunelle et al. | 324/755 |
| 2003/0061447 A1 | * | 3/2003 | Perego et al. | 711/131 |
| 2003/0080762 A1 | * | 5/2003 | Kim et al. | 324/754 |

* cited by examiner

Primary Examiner—Viet Q. Nguyen
(74) Attorney, Agent, or Firm—TraskBritt

(57) ABSTRACT

A memory module socket having a transposed pinout allowing the socket to be mounted on the second, or reverse, surface of a motherboard and connected to circuit traces configured for mounting of a memory socket on the first, or processor, surface of the motherboard to correctly accommodate signals between the motherboard and the memory module is disclosed. A motherboard having at least one memory socket mounted on the second, opposing surface enhancing access to the memory socket or sockets for insertion and removal of memory modules for testing the memory modules in multimotherboard test systems is also described. The invention further includes a method of converting a conventional motherboard and memory socket assembly for such testing.

7 Claims, 6 Drawing Sheets

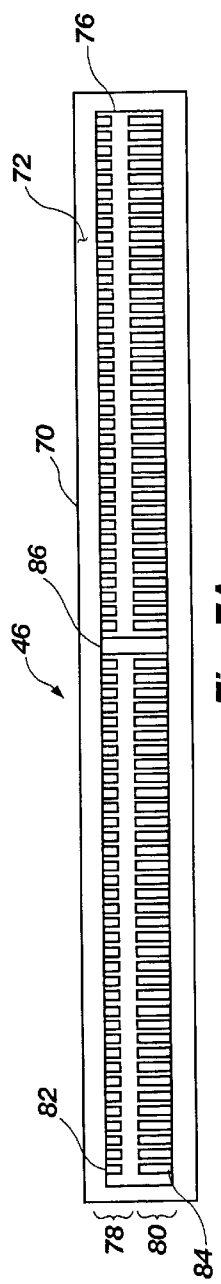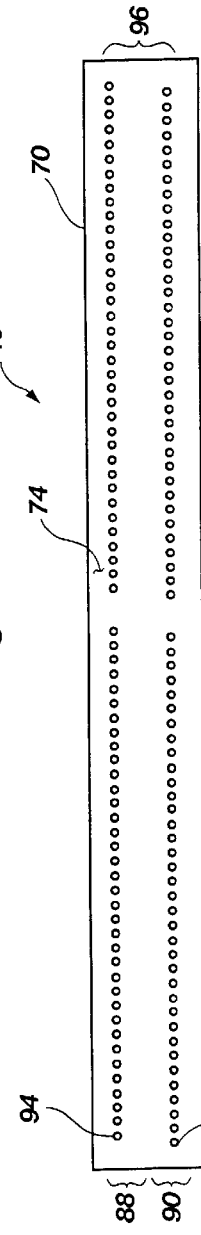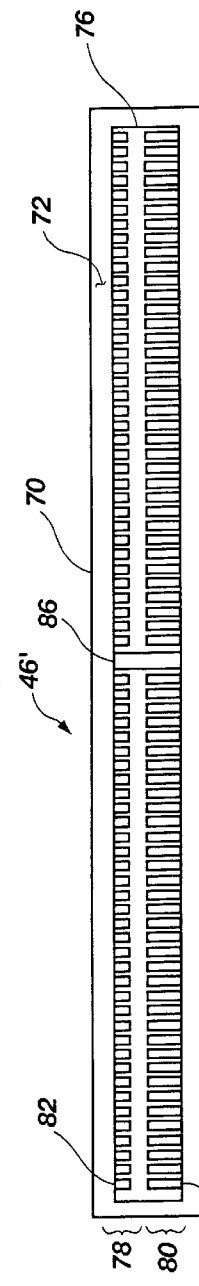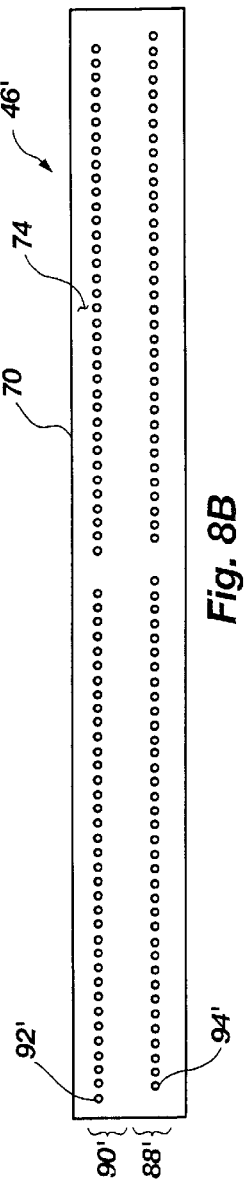

REVERSED MEMORY MODULE SOCKET, MOTHERBOARD AND TEST SYSTEM INCLUDING SAME, AND METHOD OF MODIFYING MOTHERBOARD

CROSS-REFERENCE TO RELATED APPLICATION

This application is a divisional of application Ser. No. 09/904,260, filed Jul. 12, 2001, pending.

BACKGROUND OF THE INVENTION

1. Field of the Invention

The present invention relates generally to memory module sockets used to interconnect memory modules with other computer components. More specifically, the present invention relates to a memory module socket which has a reversed pinout configuration and which is particularly suitable for memory device testing.

2. State of the Art

Semiconductor integrated circuit devices are manufactured on wafers or other substrates of semiconductor material. Conventionally, many devices are manufactured on a single wafer and individual devices or groups of devices are singulated, or cut, from the wafer and packaged. The devices are tested at various points during the manufacturing process, e.g., while they are still in the wafer form, in die form (after singulation but prior to packaging), and after packaging.

Testing may be directed towards detection of flaws or errors regarding one or more facets of semiconductor fabrication. For example, one stage of testing concerns the physical structure of the device. Such testing may include the use of various techniques known in the art such as emission microscopes or X-ray analysis. Testing of the structure typically focuses on whether discernible errors or flaws developed during the physical formation of the semiconductor die. Such flaws may be the result of one or more processing steps improperly performed, such as, for example, over-etching. Flaws are also developed as a result of contaminants introduced during the fabrication process. Indeed, numerous factors exist which may influence the introduction and development of such flaws or errors.

Another facet of testing concerns the functionality and performance of the device. This typically involves connecting the device to a circuit such that a signal or combination of signals may be passed through the device. The response by the device to the signal is then monitored, with the output value being compared to values expected to be obtained from a properly functioning device. Tests may involve a particular signal or combination of signals being delivered repetitively, perhaps under extreme environmental or operational conditions (temperature, voltage, etc.) outside of normal parameters in order to identify a device which would fail after a shorter-than-usual period of use. Other tests may involve a number of different signals or signal combinations delivered in sequence. One method for testing a memory device is to deliver the same signal or signal combination to multiple identical subsections of the device simultaneously and compare the values read from the subsections ("compression testing"). If all of the respective read values match, the test has been passed, while a mismatch between respective values read from any of the subsections indicates a device malfunction and failure of the test.

Another stage of testing may concern the compatibility of the semiconductor device with other components. For example, it becomes desirable to confirm the compatibility of a memory device having a specific design with the multitude of personal computer motherboards currently available on the market. Such testing would involve connecting identical memory modules to motherboards of different design and manufacturing origin and then subjecting the memory modules to an otherwise identical testing process. This type of testing helps to assure computer manufacturers as well as consumers that the device will function as expected regardless of who may be the manufacturer of other interconnected components.

The ultimate objective of testing is to produce a device having verified reliability and quality. While this objective is of extreme importance, the efficiency with which testing is performed is also an important concern. It becomes desirable to reduce testing time whenever possible without compromising the integrity of the testing process. A reduction in test time, without a sacrifice in quality, results in greater manufacturing throughput and thus lowers manufacturing costs. Reduced manufacturing costs are very desirable in that they ultimately lead to higher profits for the company, as well as a savings to the consumer.

One method of reducing testing time without compromising the integrity of the testing process is to perform batch tests. In other words, numerous devices are tested coterminously instead of testing each device sequentially, one at a time. An example of such testing, with regards to memory devices, can be better understood with reference to FIG. 1. A testing apparatus 10 may include a plurality of motherboards 12 housed in a holding device such as a cabinet or a frame 14. A plurality of memory devices, such as dynamic random access memory (DRAM) or other memory modules 16, is appropriately coupled to individual memory sockets 18. Each memory socket 18 is operatively coupled to a motherboard 12 with each motherboard 12 including multiple memory sockets 18. Thus, each motherboard 12 is capable of accommodating several memory modules 16 during a given testing operation.

It is noted that the testing apparatus 10 is illustrated as holding identical motherboards. However, as noted above, such a testing apparatus 10 may accommodate various motherboard styles, designs, and sizes. Thus, the system as described may be employed in various facets of testing, including compatibility testing.

With the memory modules 16 in place, functional testing or, alternatively, compatibility testing of the memory modules 16 is conducted. As described above, the motherboards 12 provide a signal, or signals, to the memory modules 16 and then monitor the responsive output of each memory module 16. The configuration as described above allows numerous memory modules 16 to be tested in a relatively short amount of time. However, while the above-described system allows for a greater quantity of devices to be tested at a given time, the turnaround time in removing tested modules and subsequent installation of untested modules is less than optimal.

One problem with a testing apparatus configuration such as is illustrated in FIG. 1 is that, in an effort to maximize the number of memory modules 16 being tested at a given time, the ability to remove and replace the memory modules 16 becomes compromised. This essentially results from the density and close proximity of the motherboards 12 within the cabinet or frame 14 combined with the configuration and orientation of the memory sockets 18 on the motherboard 12. A typical motherboard 12 is configured such that the memory sockets 18 are mounted along a planar surface of the motherboard 12 so that memory modules 16 respectively inserted therein extend transversely away from the motherboard 12. Furthermore, the memory sockets 18 are typically fixed in their locations by mechanical means including soldering, riveting and other techniques known in the art. Therefore, to extract a memory module 16 from a memory socket 18, it must be withdrawn from memory socket 18 in a direction perpendicular to the planar surface of the motherboard 12. However, in a testing apparatus 10 where the motherboards 12 are configured in close vertical proximity to each other, removal of the memory module 16 becomes rather difficult and time consuming.

For example, still referring to FIG. 1, distance 'A' represents the distance between the top of a memory module 16 and an adjacent motherboard 12. Distance 'B', on the other hand, represents the minimum distance that the memory module 16 must travel in order to be removed from the memory socket 18 (i.e., the distance required for the bottom of the memory module 16 to clear the top of the memory socket 18). It may often be the case that distance 'B' is greater than distance 'A'. In such a case, it becomes physically impossible to remove the memory modules 16 (or insert them) unless the motherboards 12 are first removed from the frame 14. In the instance of a cabinet or frame 14 holding a plurality of motherboards 12, each having a plurality of memory sockets 18, replacement of the memory modules 16 thus becomes a laborious and time-consuming task. Even if the motherboards 12 are spaced in cabinet or frame 14 so that distance 'A' becomes larger than distance 'B', it remains difficult for an individual to maneuver his or her hands in between the vertically superimposed motherboards 12 and complete the task of insertion or removal of the memory modules 16 with any degree of efficiency.

It is conceivable that the motherboards 12 might be arranged such that the upper planar surface of each motherboard 12 is adjacent to and runs parallel with the vertical member of the cabinet or frame 14. However, this is not an ideal solution either. While this would allow the memory modules 16 to be exposed to the space external to the cabinet or frame 14 and be removed from memory sockets 18 in a horizontal direction, an access problem may still exist. For example, expansion slots 20, while shown empty in FIG. 1, typically accommodate peripheral cards allowing communication from the motherboard 12 to additional devices. When peripheral cards are installed, they present additional difficulties regarding access to the memory modules 16 due to their close proximity to the memory modules 16 on the same top surface of the motherboard 12. Similarly, other semiconductor components and device connections may create access difficulties based on the dense arrangement of all these components on the same surface of the motherboard 12.

In view of the above-enumerated shortcomings in the state of the art, it would be advantageous to reduce the amount of time required for the removal and replacement of memory modules from a testing apparatus.

It would also be advantageous to provide enhanced access to specific semiconductor components during functional testing or compatibility testing.

It would also be advantageous to provide an apparatus or system which could be configured for use with an automatic handling unit to remove and replace memory modules in a testing apparatus. Such an apparatus or system should be flexible and adaptable to a user's needs, as well as simple to fabricate and operate.

BRIEF SUMMARY OF THE INVENTION

One exemplary embodiment of the present invention comprises a memory socket for facilitating a test connection of a memory module with a motherboard. The memory socket includes an insulative housing having an elongated channel-shaped socket formed within the housing. The elongated socket is configured to have a memory module, such as, for example, a single in-line memory module (SIMM) or dual in-line memory module (DIMM), coupled thereto. A set of conductive contacts is arranged within the elongated socket for proper electrical connection with respective, cooperative pinout contacts of the memory module. A second set of conductive contacts, electrically connected to the first set of conductive contacts and configured for connection to the motherboard, is arranged in a reverse or mirror image arrangement of a conventional memory socket second conductive contact pattern.

The first surface of the motherboard is defined to have at least the central processing unit (CPU) or "processor" (or corresponding processor socket) mounted to it, while the second, opposing surface is where the inventive memory socket is to be mounted. The second, reversed set of conductive elements may comprise conductive pins which will pass from the memory socket adjacent the second surface through corresponding apertures in the motherboard sized and arranged to receive conductive pins of a conventional memory socket mounted to the first surface. The pins of the inventive memory socket may, by way of example only, be arranged in at least two parallel rows forming an asymmetrical pin set such that the same socket would not mate with the apertures of the motherboard on both the first surface and the second surface.

Another exemplary embodiment of the present invention comprises a motherboard. The motherboard includes a dielectric substrate having a first surface and a second, opposing surface and bears a plurality of conductive traces. A processor, or a processor socket configured to couple to a processor, is mounted at a processor location on the first surface of the motherboard. A memory socket is mounted on the second surface of the motherboard and is electrically coupled to the processor location by way of conductive traces of the motherboard. A plurality of memory sockets may be mounted to the second surface as described if the motherboard is configured with traces for multiple memory sockets. The motherboard may also include additional devices such as one or more expansion slots, or other semiconductor devices, coupled to the first surface of the motherboard and electrically coupled to the processor via traces.

The memory socket may be configured to receive one of various types of memory modules known in the art. The various types of memory modules may include, for example, 30 pin SIMM modules, 72 pin SIMM modules, 168 pin DIMM modules, the various forms of small outline DIMM modules typically used in notebook type computers, or RIMM modules incorporating the so-called Rambus memory dice.

In accordance with yet another exemplary embodiment of the invention, a system for testing memory modules is provided. The test system includes a plurality of motherboard assemblies which may be mounted to a frame. Each motherboard assembly includes a dielectric substrate having first and second opposing surfaces and bears a series of circuit traces. A processor, or a processor socket adapted to receive a processor at a processor location, is mounted on the first surface of each motherboard. At least one memory socket is mounted on the second surface of each motherboard assembly and is electrically coupled to the processor or socket by way of traces. Each motherboard is coupled to an input device for providing electrical test signals and a monitoring device for receiving output signals from the motherboard assembly. The system may be configured for use with an automated handling unit for inserting memory modules in the memory sockets and removing and replacing those memory modules after a testing cycle has been completed.

In accordance with yet another exemplary embodiment of the invention, a method is provided for reconfiguring a motherboard for use in the testing of a memory device. In accordance with the method, a motherboard is provided having a dielectric substrate having first and second opposing surfaces and bearing a series of circuit traces defining a printed circuit. The motherboard further includes a processor, or processor socket, mounted to the first surface at a processor location and at least one conventional memory socket mounted to the first surface, wherein the processor and memory socket are electrically connected by means of traces. The conventional memory socket is removed from the first surface, and a memory socket according to the invention is mounted on the second surface and coupled to the processor through the same traces as the conventional memory socket. The reconfiguring process may include reflowing solder connections of the original, conventional memory socket to detach it from the first surface. The method may further include arranging an array of electrical contacts of the inventive memory socket in reverse or mirror image of the pattern of contacts so that they mate with the existing pattern of conductive elements on the motherboard arranged for coupling to conductive contacts of the conventional memory socket when the inventive memory socket is mounted to the second surface.

BRIEF DESCRIPTION OF THE SEVERAL VIEWS OF THE DRAWINGS

The foregoing and other advantages of the invention will become apparent upon reading the following detailed description and upon reference to the drawings in which:

FIG. 7A is a view of the top side of a conventional memory socket;

FIG. 7B is a view of the bottom side of the memory socket shown in FIG. 7A;

FIG. 8A is a view of the top side of a memory socket according to one aspect of the invention;

FIG. 8B is a view of the bottom side of the memory socket shown in FIG. 8A according to one aspect of the invention.

DETAILED DESCRIPTION OF THE INVENTION

Figure 1:
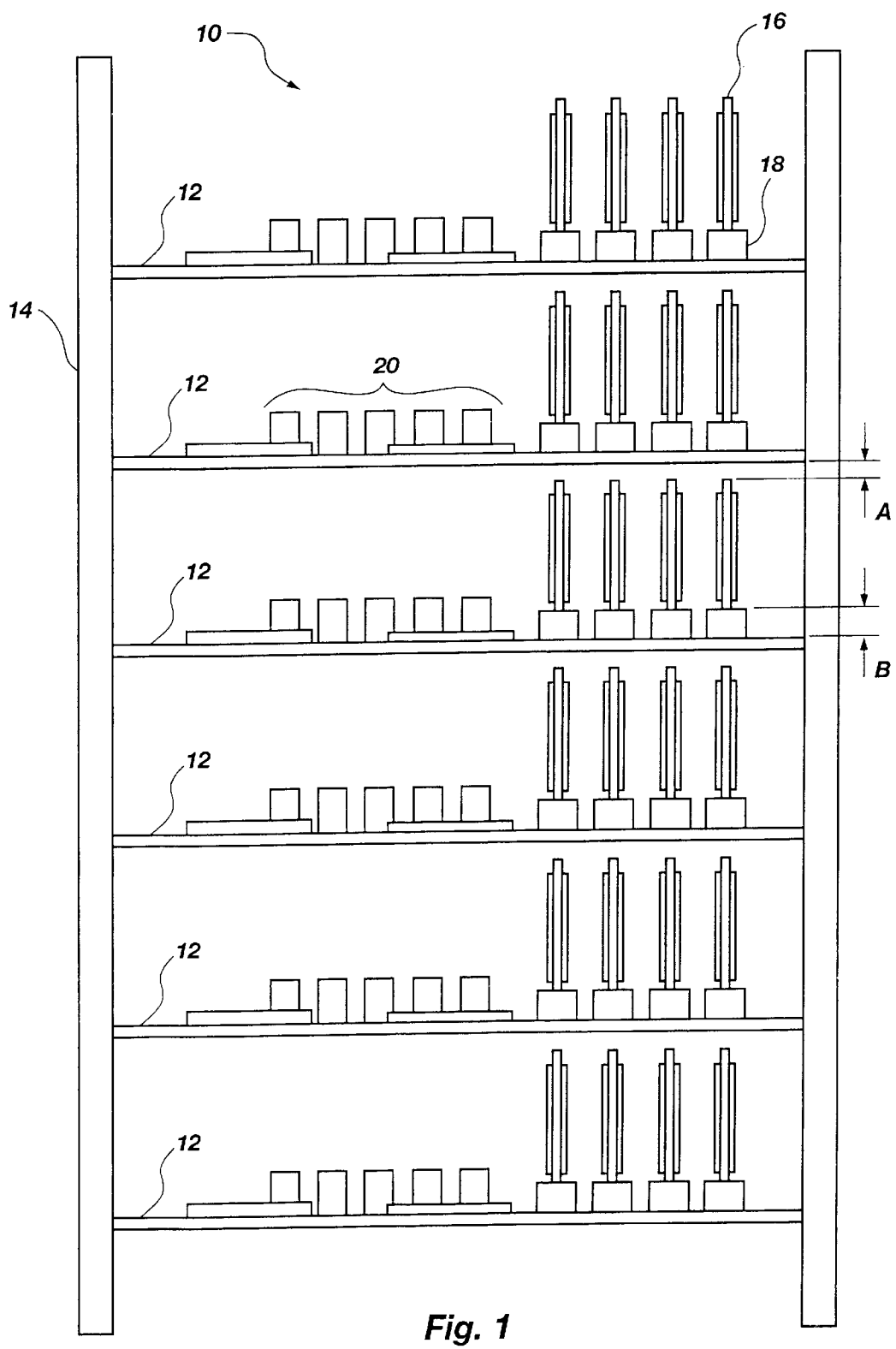
FIG. 1 is a plan view depicting a prior art memory testing system.
Figure 2A:
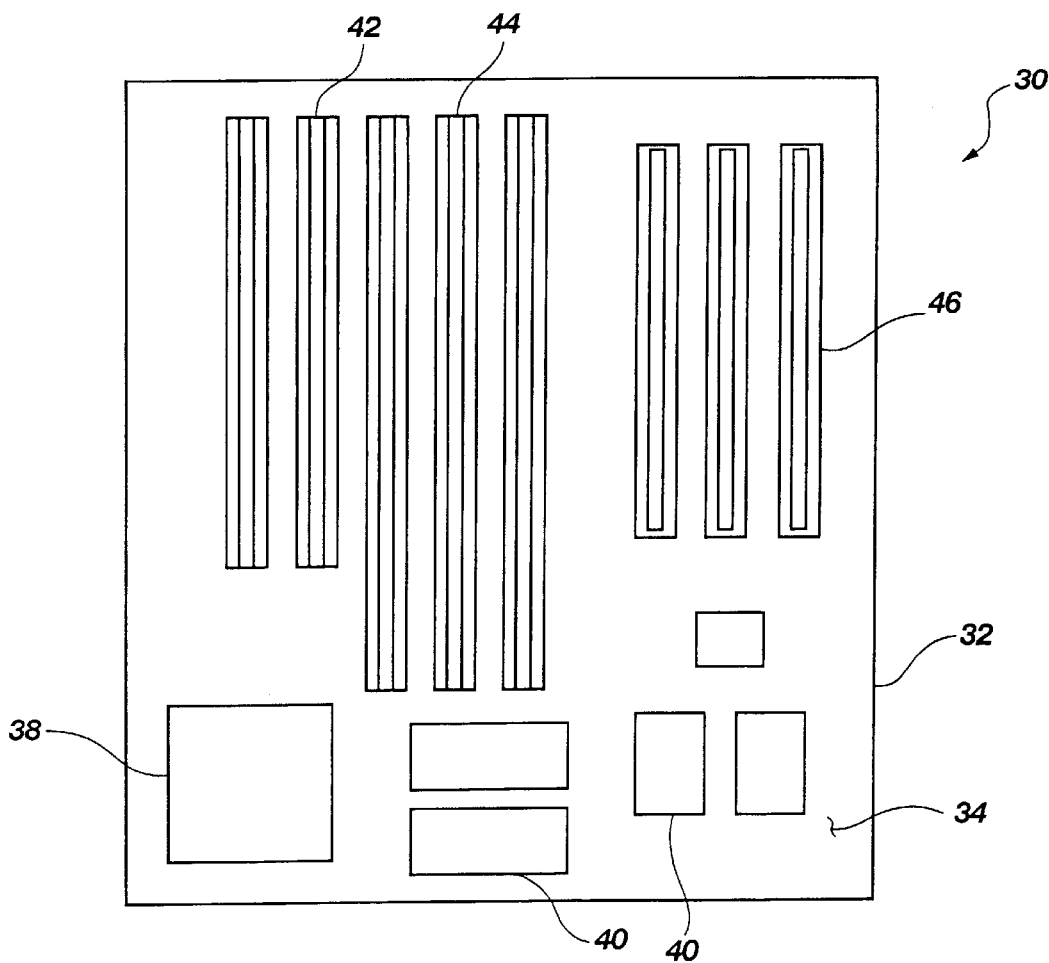
FIG. 2A is a plan view of the top side of a conventional motherboard assembly.
Figure 2B:
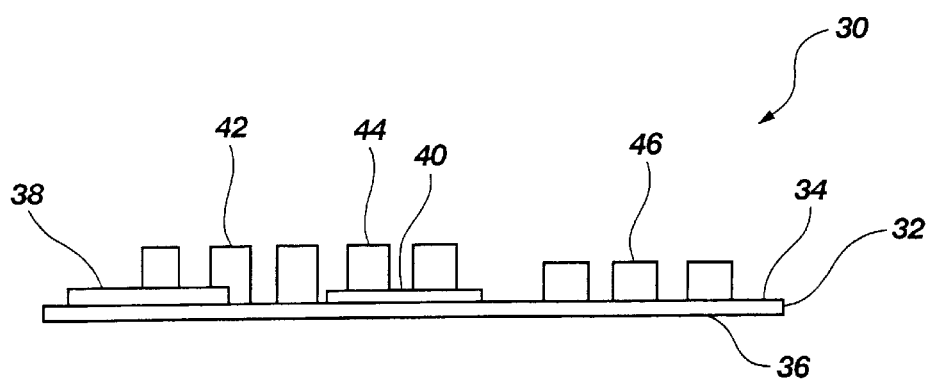
FIG. 2B is an elevational view of the conventional motherboard assembly depicted in FIG. 2A.

Referring to FIGS. 2A and 2B, a motherboard 30 suitable for use in certain aspects of the present invention is shown. The motherboard 30 comprises a dielectric substrate 32 having circuit traces formed therewith. The substrate 32 is defined by a first surface 34 and a second, opposing surface 36. The first surface 34 may be understood to have various components mounted thereon. Such components may include, for example, a central processing unit (CPU) 38, other semiconductor devices, or chips 40, and input/output connections such as expansion slots 42 and 44, which may represent PCI slots, ISA slots, AGP slots or connections pursuant to various other standards. It is noted that while the motherboard 30 is described as having a CPU 38 directly mounted to the first surface 34, such numbering also corresponds to exemplify the location of a processor socket operatively coupled to the motherboard 30. The CPU 38 may then be removed from the socket and replaced as required.

The expansion slots 42 and 44 allow for communication with various input, output and peripheral devices (not shown) of a personal computer. Such devices may include, for example, a monitor, keyboard, printer, scanner, secondary input device such as a mouse or other pointer, modem or network card. These devices are typically connected to the motherboard 30 by inserting an add-on card into one of the expansion slots 42 or 44 and connecting the peripheral device to the add-on card. The add-on cards typically have independent circuitry and semiconductor devices associated with them and are adapted to interact with the motherboard 30 such that the CPU 38 may process signals received from the add-on card and provide signals to the add-on card for control of the associated device. Alternatively, the motherboard 30 may have many, if not all, of the basic peripheral connections built-in so that add-on cards are not required.

Figure 3:
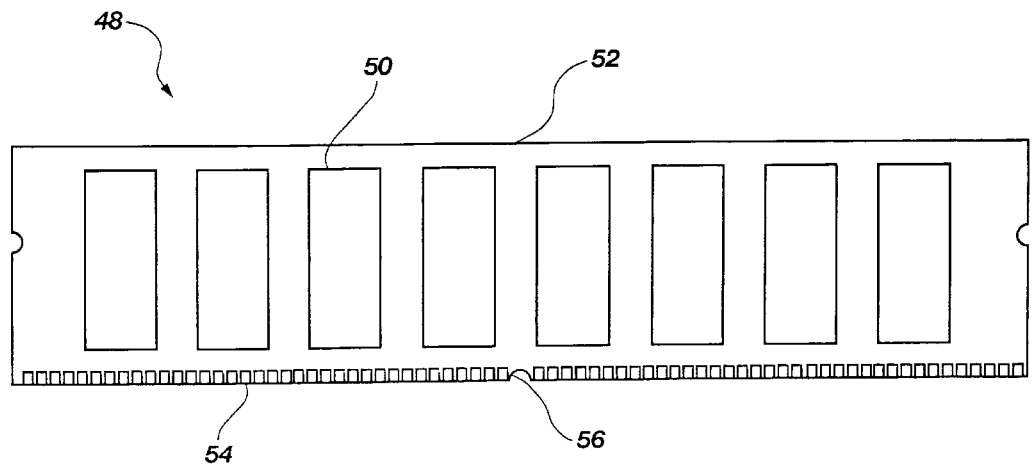
FIG. 3 is an elevational view of an exemplary memory module suitable for insertion into a memory socket of the present invention.

Also connected to the motherboard 30 is a plurality of resident memory sockets or slots 46. Each memory socket 46 is adapted to releasably receive a random access memory (RAM) device or, more typically, a memory module of one of the aforementioned types comprising a carrier substrate bearing a plurality of memory chips. A memory module 48, as shown in FIG. 3, typically comprises several memory chips 50 mounted on one or both sides of a printed circuit board 52. The memory chips 50 are linked by circuit traces extending across the printed circuit board 52 so that the motherboard 30 (not shown) "sees" them in the circuit including the memory module 48 as a continuous memory device. The memory module 48 also includes a plurality of conductive contacts 54 in one or more rows along an edge of printed circuit board 52 and may include a keyed (notched) section 56 aligned on one edge of the circuit board 52 for interconnection with the memory socket 46 (not shown).

RAM memory modules are produced in various forms such as, for example, static RAM (SRAM), dynamic RAM (DRAM), synchronous dynamic RAM (SDRAM), Rambus dynamic RAM (RDRAM), extended data out (EDO) RAM, double data rate (DDR) RAM, as well as others. The various types of memory devices each have associated logic and connective structures of the module to which they are mounted which allows them to communicate with the CPU 38 through interconnection with the motherboard 30. The memory module 48 receives digital data from the CPU 38 in the form of electrical signals and retains the data for later retrieval. In addition to the various types of memory devices available, they are also available in different interface styles. In other words, the type of memory socket being used must be both physically and electrically compatible with the memory module being coupled with it. Exemplary interfaces used in the industry include single in-line memory modules (SIMMs), dual in-line memory modules (DIMMs) and small outline DIMMs. These interfaces differ in the number and arrangement of conductive connections required with the motherboard 30, as well as in the bus width supported by each (the amount of data allowed to be transferred between the memory device and the CPU 38 at a given time). In addition to these interfaces, proprietary memory modules are also available, i.e., modules having interfaces which are not based on the industry standards, such as Rambus in-line memory modules, or RIMMs. The differences in these memory types and interfaces are well recognized and understood by those of ordinary skill in the art and so are not discussed in more detail herein.

In addition to the memory devices and modules mentioned above, other memory devices and modules are continually being developed and improved. Such improvements often result in larger memory size, measured in units of bytes and typically expressed in megabytes (MB), as well as the speed at which the memory device performs, expressed in MHZ. It is contemplated that memory sockets adapted for use with any type or design of memory module, including those which are newly designed and improved, are within the scope of the present invention.

Figure 4:
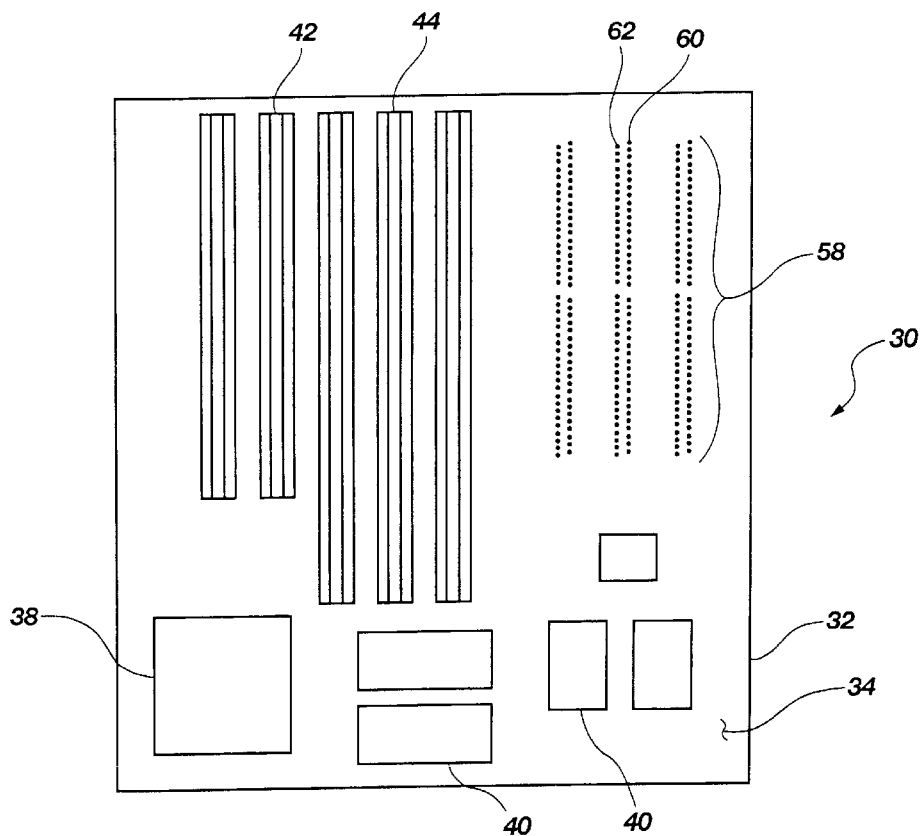
FIG. 4 is a plan view of the top side of the motherboard assembly depicted in FIG. 2A showing specific connective features.

Referring now to FIG. 4, motherboard 30 is shown having the conventional memory sockets 46 removed from the first surface 34 of the dielectric substrate 32. A set 58 of apertures is located in the dielectric substrate 32 where each of the memory sockets 46 previously resided. The individual apertures 60 and 62 comprise conductive elements connected to the printed circuit traces of substrate 32. Each set 58 of apertures represents the required number and arrangement of electrical connections for a given memory socket 46 to render proper communication between the CPU 38 and the memory module 48 (FIG. 3).

Figure 5:
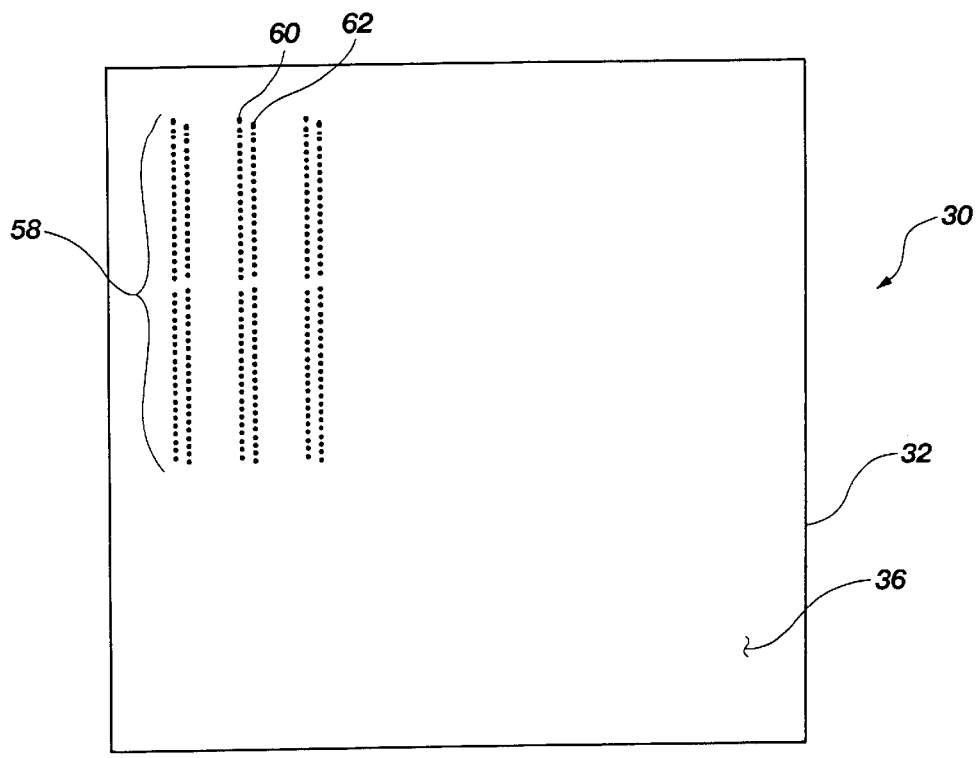
FIG. 5 is a plan view of the bottom side of the motherboard assembly of FIG. 4 showing specific connective features.

Referring to FIG. 5, a view of the second, opposing surface 36 of dielectric substrate 32 of the motherboard 30 is shown. It is noted that no components are mounted to the second, opposing surface 36 of dielectric substrate 32, which can also be seen in FIG. 2A. However, in FIG. 5 it is seen that the sets 58 of apertures 60 and 62 are shown to extend continuously from the first surface 34 through the substrate 32 to the second, opposing surface 36 of dielectric substrate 32. With the apertures 60 and 62 extending completely through the substrate 32, the conductive elements are accessible from either of the surfaces 34 and 36 of the substrate 32. It is also noted that each set 58 of apertures 60 and 62 is arranged in an asymmetrical manner, in that each set 58 of apertures includes two respective rows of apertures 60 and 62 longitudinally offset from each other. This can be seen and readily appreciated in comparing the arrangement of a set 58 of apertures 60 and 62 as viewed in FIG. 4 with the same set 58 of apertures 60 and 62 as viewed in FIG. 5. The arrangement of these apertures/conductive elements will be discussed in more detail below.

Figure 6:
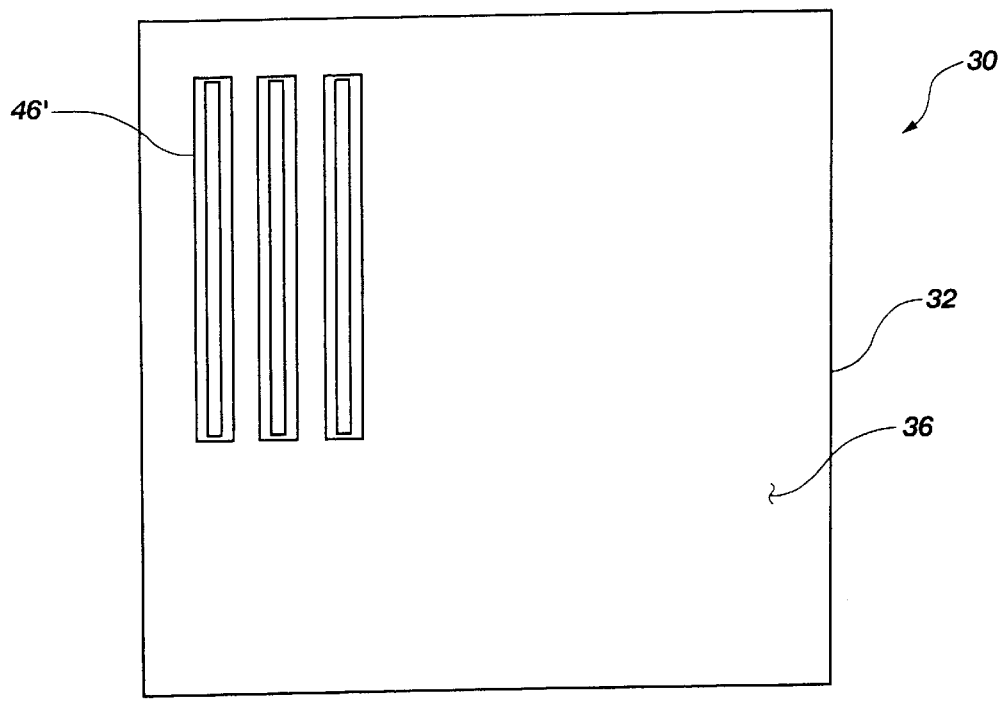
FIG. 6 is a plan view of the bottom side of a motherboard assembly according to one aspect of the invention.

Referring to FIG. 6, an elevational view of the motherboard 30 is shown wherein a plurality of memory sockets 46' is mounted to the second, opposing surface 36 of dielectric substrate 32 of the motherboard 30. The memory sockets 46' are similar to the original, conventional memory sockets 46 discussed in connection with FIGS. 2A and 2B in that they are configured to receive the same type or design of memory module 48. However, as will be discussed in greater detail below, the new memory sockets 46' have a slightly different pinout configuration so as to be mountable on the second, opposing surface 36 of dielectric substrate 32, or reverse side, of the motherboard 30. It is possible and contemplated as being within the scope of the present invention that the original memory sockets 46 may be modified to conform with the mounting requirements of the new memory sockets 46' so that the appropriate pins of memory sockets 46 will connect to the appropriate apertures 60 and 62 of a given set 58 of apertures from the second, opposing surface 36 of dielectric substrate 32. Such modification may be effected using an interposer to which memory socket 46 may be connected, the pinout arrangement of memory socket 46 being rearranged within the interposer so as to be compatible with the arrangement of a given set 58 of apertures 60 and 62 from second, opposing surface 36 of dielectric substrate 32 of motherboard 30. However, it is more preferred that the inventive memory sockets 46' will be originally manufactured for mounting on the second, opposing surface 36 of dielectric substrate 32 of the motherboard 30.

Referring now to FIGS. 7A and 7B, an exemplary original, conventional memory socket 46, as utilized in conjunction with FIGS. 2A and 2B, is shown. The memory socket 46 is shown in FIG. 7A as viewed from the top surface 72 thereof while FIG. 7B depicts the memory socket 46 as viewed from the bottom surface 74 thereof. The memory socket 46 includes an insulative or dielectric housing 70. An elongated channel, or slot, 76 is formed in the top surface 72 of the housing 70. Along one edge of the channel 76 is a first row 78 of individual conductive elements or contacts 82. Along an opposing edge of the channel 76 is a second row 80 of individual conductive elements or contacts 84. The contacts 84 and 82 are formed and located so as to engage the conductive contacts 54 of a memory module 48 as disclosed in FIG. 3. While FIG. 3 only depicts one side of a memory module 48, the opposing surface may carry a similar set of conductive contacts 54, thus creating two rows of conductive contacts 54 (the conductive contacts 54 of one row being optionally electrically isolated or in communication with those of the other row, depending on the module design) for engagement with the two rows of contacts 78 and 80 housed in the memory socket 46. A key element 86 is also located in the channel 76 for mating with the notched section 56 of the memory module 48 to facilitate proper installation of memory module 48 into the memory socket 46.

FIG. 7B discloses a first row 88 of conductive contacts, shown here as conductive pins 94. A second row 90 of conductive contacts or pins 92 runs parallel to the first row 88. The conductive pins 92 and 94 protrude through the bottom surface 74 of the insulative housing 70 and, as illustrated, are each electrically coupled to one of the conductive contacts 82 and 84. For sake of clarity and discussion herein, it will be assumed that each conductive pin 92 is electrically coupled to a conductive contact 82 and that each conductive pin 94 is electrically coupled to a conductive contact 84.

As noted above, the memory socket 46 shown in FIGS. 7A and 7B is configured for mounting to the first surface 34 of the substrate 32. This configuration is established by the pattern formed by the conductive pins 92 and 94 on the bottom surface 74 of the memory socket 46. It is noted that the conductive pins 92 and 94 are arranged in two rows 88 and 90 and that the first row 88 is (as illustrated) offset slightly to the left of the second parallel row 90. Thus, if the two rows are considered together as one set 96 of pins, the set 96 is asymmetrical in configuration. Referring again to FIG. 4, the set 58 of apertures 60 and 62 is also arranged in an asymmetric pattern of two parallel rows. It is noted that the staggered or offset pattern of conductive pins 92 and 94 located on the memory socket 46 is arranged to mirror and mate with a corresponding pattern created by the set 58 of apertures 60 and 62. Thus, for example, each conductive pin 92 would be inserted into and coupled with a conductive aperture 60 comprising a conductive element and creating an electrical connection between a conductive contact 84 of the memory socket 46 and the printed circuit traces of the motherboard 30 via aperture 60. Similarly, each conductive pin 94 would be inserted into and coupled with an aperture 62, creating an electrical connection between conductive contacts 82 and the printed circuit traces of motherboard 30 via aperture 62. Thus, the conductive pins 94 and 92 found in the two rows 88 and 90, respectively, would correlate with the mating set 58 of apertures 62 and 60. Once inserted into the apertures 60 and 62, the pins 92 and 94 are typically soldered, as is well-known in the art, to secure and maintain a proper mechanical and electrical connection between the printed circuit traces of the motherboard 30 and the memory socket 46.

Referring to FIGS. 8A and 8B, an exemplary, modified memory socket 46' according to the present invention is shown. As discussed above, the modified memory socket 46' is configured for mounting to the second, opposing surface 36 of dielectric substrate 32 of the motherboard 30. The modified memory socket 46' is similar to the original memory socket 46 and, therefore, like numbering is maintained for like elements and features. The modified memory socket 46' includes a housing 70 having an elongated channel 76 formed in the top surface 72 of the housing 70. The elongated channel 76 houses a first row 78 of conductive contacts 82 and a second row 80 of conductive contacts 84. The two rows 78 and 80 are on opposing sides of the channel 76 and run parallel to each other. A key element 86 is also located in the channel 76 for mating with a notched section 56 of a memory module 48 as described above.

The modified memory socket 46' also has a pair of rows of conductive contacts, shown as pins, but the pin arrangement differs from that of the original memory socket 46. FIG. 8B shows a first row 90' of conductive pins 92' disposed on the bottom surface 74 of the modified memory socket 46' and a second row 88' of conductive pins 94' located adjacent and parallel to the first row 90'. The two rows 88' and 90' form an asymmetric pin or contact pattern. However, the pin arrangement of the modified memory socket 46' differs from that of the original socket 46 as shown in FIG. 7B. Specifically, the rows 88' and 90' are arranged in a mirror image pattern in comparison to the pin rows 88 and 90 of the original memory socket 46. Stated another way, the pin arrangement of modified memory socket 46' is reversed from that of memory socket 46. While individual pin positions have been relocated in modified memory socket 46', each pin is coupled to the same, corresponding electrical contacts as on memory socket 46. So, for example, each conductive pin 92', while moved from its original physical position (i.e., from the location of a corresponding pin 92 in FIG. 7B), is still designated as being electrically coupled to conductive contact 82. Likewise, each conductive pin 94', while moved from its original physical position (i.e., from the location of pin 94 in FIG. 7B) remains as the designated electrical connection with conductive contact 84.

By physically moving the pin locations while still maintaining the electrical pinto-contact relationships defined in the original memory socket 46, the modified memory socket 46' may be mounted to the bottom side, or second, opposing surface 36 of dielectric substrate 32, of the motherboard 30. This is physically possible because, as viewed from both sides of the motherboard, the set of apertures 58 viewed from first surface 34 forms a mirror or reverse image pattern with itself as viewed from second, opposing surface 36 of dielectric substrate 32. Thus, the pin arrangement of the modified socket 46'—configured as a mirror image of the pin set of the original socket 46—physically mates with the set of apertures 58 from the second, opposing surface 36 of the dielectric substrate 32. Specifically, pins 92' and 94' of the modified memory socket 46' may now be inserted into apertures 60 and 62 respectively (as shown in FIG. 5) from the second, opposing surface 36 of dielectric substrate 32 of the motherboard 30.

Significantly, not only does the modified memory socket 46' physically mate with the set of apertures 58 as seen from the second, opposing surface 36 of dielectric substrate 32, but the electrical circuit including memory socket 46' remains the same as when the original socket 46 was mounted to the first surface 34 of the substrate 32. Using the examples and relationships defined above, each conductive contact 82 of the modified memory socket 46' is connected to an associated conductive pin 92', which is then correctly inserted in and coupled to an aperture 60. Likewise, each conductive contact 84 of the modified memory socket 46' is connected to an associated conductive pin 94' which is correctly inserted in and coupled to an aperture 62. Thus, even though the physical location of the memory socket has changed (i.e., from the first surface 34 of the substrate 32 to the second, opposing surface 36 of dielectric substrate 32) and even though the conductive pin arrangement has been modified, the same circuit is formed upon insertion of a memory module 48 into the modified memory socket 46'. Therefore, regardless of whether the original memory socket 46 is mounted to the first surface 34 or the modified socket 46' is mounted to the second, opposing surface 36 of dielectric substrate 32, each individual conductive contact denoted as 82 will be electrically coupled to its correctly associated aperture 60 and each individual conductive contact denoted as 84 will be electrically coupled to its correctly associated aperture 62. Thus, all redundant electrical contacts of the sockets 46 or 46' retain identity with respective, associated conductive apertures found in the motherboard 30.

A modified memory socket 46' as described above, which may be generally referred to as having a reverse pinout, may be mounted and coupled to the reverse side (second, opposing surface 36 of dielectric substrate 32) of a motherboard 30 to place the memory socket 46' in an area unencumbered by other chips, slots or expansion devices. Thus, the memory sockets 46' are now placed in a location allowing access to the associated memory modules 48 freely and without difficulty. This method of modification may be implemented with any existing motherboard 30 and is generally depicted by referring sequentially to FIGS. 2A, 4, 5, and 6. FIG. 2A shows the motherboard 30 having the original memory sockets 46 mounted and electrically coupled to the printed circuit traces of the motherboard 30. As noted above, the memory socket 46 is typically mounted by inserting conductive pins into corresponding apertures found in the motherboard 30 and then soldering the pins within the apertures. Thus, removal of the memory socket 46 entails the reflow of the solder (i.e., raising the solder to a temperature which allows it to change into a liquid phase) and the subsequent removal of the memory socket 46 from the substrate 32 as well as cleaning of solder therefrom. Following the removal of the memory socket 46, a modified memory socket 46' according to the invention and having a reversed pin-out is provided. The conductive pins of the modified memory socket 46' are inserted into the set of apertures 58 from the second, opposing surface 36 of dielectric substrate 32 of the motherboard 30. The conductive pins are then soldered to the set 58 of apertures, forming an electrical connection. The motherboard 30 is then in condition to be used as a memory testing device, or in any other capacity wherein greater access to the memory modules/sockets is desired.

Figure 9:
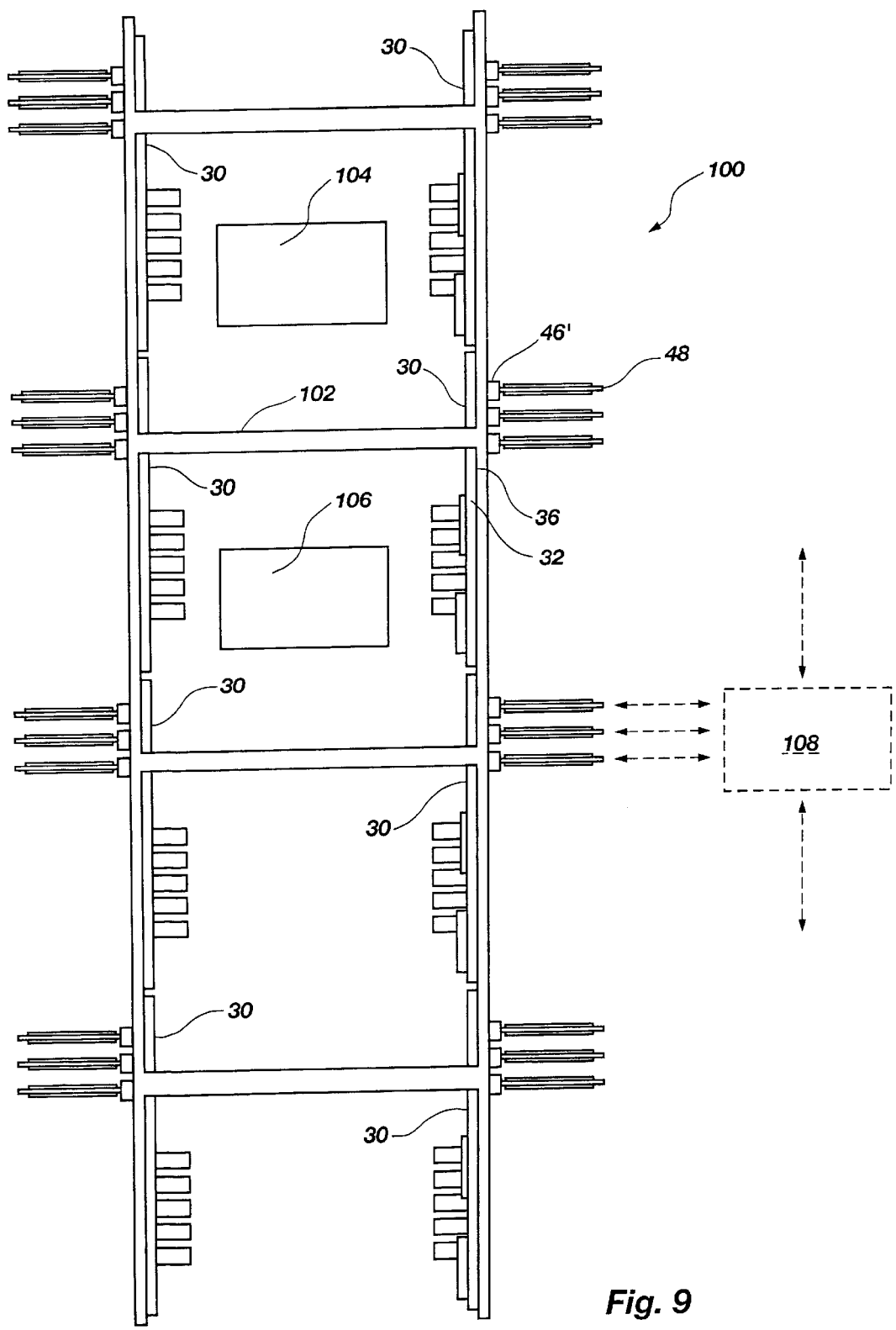
FIG. 9 is an elevational view of a system for testing memory modules according to certain aspects of the present invention.

Referring now to FIG. 9, a memory testing system 100 is shown in accordance with the present invention. The system 100 includes a frame 102 to which a plurality of motherboards 30 is mounted. The motherboards 30 are configured in accordance with the above disclosure and like numerals are used to reference like elements and features. Each motherboard 30 includes a plurality of modified memory sockets 46' mounted on the second, opposing surface 36 of the motherboard's dielectric substrate 32 (not shown). The memory sockets 46' each receive a memory module 48 as part of a testing sequence. The motherboards 30 are mounted vertically such that the second, opposing surface 36 of dielectric substrate 32 and associated memory sockets 46' are readily accessible. In the specific embodiment shown, the second, opposing surface 36 of dielectric substrate 32 is mounted facing the exterior of the frame 102. This specific embodiment further shows that the motherboards 30 may be mounted adjacent each other in multiple horizontal rows and vertical columns defining a matrix of motherboards 30. However, it is noted that the frame design and arrangement of motherboards relative to the frame may be modified in numerous ways to accommodate the end user, or the programmed patterns of an automated handling unit. For example, motherboards of various styles, sizes and manufacture may be implemented with such a system. Furthermore, different motherboards 30 may be intermixed within a single system. FIG. 9 also schematically illustrates an input device 104 to generate test signals and a monitoring device 106 to receive signals from the motherboards 30. FIG. 9 further schematically illustrates that insertion and removal of memory modules 48 may be effected automatically through use of an automated (robotic) system 108 as schematically illustrated in broken lines, as clear access to each horizontally oriented memory module 48 is provided.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system for testing memory modules comprising:
    a plurality of motherboard assemblies, each motherboard assembly of the plurality including:
        a substrate having a first surface, a second, opposing surface and a plurality of conductive traces;
        a processor mounted on the first surface of the substrate and in communication with the conductive traces of the plurality; and
        at least one memory socket mounted on the second, opposing surface of the substrate, the at least one memory socket including a cavity configured to receive a portion of a memory module therein and to operably couple the memory module with the processor through the conductive traces of the plurality; and
    an input device operably coupled to each of the plurality of motherboard assemblies for providing electrical test signals to the memory module.

2. The system of claim 1, further comprising a frame supporting the plurality of motherboard assemblies thereon.

3. The system of claim 2, wherein each of the plurality of motherboard assemblies is mounted and oriented such that the cavity of the at least one memory socket is facing away from the frame.

4. The system of claim 3, wherein each of the plurality of motherboard assemblies is mounted vertically on the frame and the cavity of the at least one memory socket is oriented horizontally.

5. The system of claim 4, wherein the motherboard assemblies of the plurality are arranged in horizontal rows and vertical columns.

6. The system of claim 1, further including a monitoring device operably coupled to each of the plurality of motherboard assemblies for receiving signals therefrom.

7. The system of claim 1, further including an automated system configured for removing the memory module from and inserting the memory module into the at least one memory socket of the plurality of motherboard assemblies.

* * * * *